United States Patent [19]

DeWilde

[11] Patent Number: 5,202,816
[45] Date of Patent: Apr. 13, 1993

[54] HIGH DENSITY CIRCUIT BOARD CHASSIS COOLING SYSTEM

[76] Inventor: Mark A. DeWilde, 8 Ocean Dr., Freeville, N.Y. 13068

[21] Appl. No.: 702,559

[22] Filed: May 20, 1991

[51] Int. Cl.[5] .............................................. H05K 7/20
[52] U.S. Cl. .................................... 361/384; 165/80.3; 361/415
[58] Field of Search ........................ 174/16.1; 98/33.1; 165/80.3, 101, 122, 126; 361/383, 379, 384, 415, 381, 382, 390, 412, 413, 415

[56] References Cited

U.S. PATENT DOCUMENTS

| | | | |
|---|---|---|---|
| 2,380,026 | 7/1945 | Clarke | 361/384 |
| 3,771,293 | 11/1973 | Vest | 55/319 |
| 4,233,644 | 11/1980 | Hwang | 361/384 |
| 4,489,363 | 12/1984 | Goldberg | 361/383 |
| 4,648,007 | 3/1987 | Garner | 361/384 |
| 4,860,163 | 8/1989 | Sarath | 361/383 |
| 4,911,231 | 3/1990 | Horne | 165/104.34 |
| 5,027,254 | 6/1991 | Corfits | 361/384 |

FOREIGN PATENT DOCUMENTS 3734972 4/1989 Fed. Rep. of Germany .

Primary Examiner—Gerald P. Tolin
Attorney, Agent, or Firm—Salzman & Levy

[57] ABSTRACT

The present invention features a system for cooling a plurality of circuit boards in a high density chassis. The system includes a circuit board enclosure assembly having a number of slots for supporting a plurality of circuit boards. A filter is disposed beneath the circuit board enclosure assembly for filtering air flowing into the circuit board enclosure. The filter also creates air turbulence, and provides a pressure head adjacent the plurality of circuit boards. An air flow is generated by a dual cage type blower that is offset from the circuit board enclosure assembly. The air flow to the circuit boards is at sufficient air pressure and air flow rate to carry heat from the circuit boards. A multi-channel plenum disposed between the dual cage type blower and the circuit board enclosure assembly diffuses and directs the air flow to the circuit board enclosure assembly in a substantially flat profile. The multi-channel plenum individually distributes the air to each of said circuit boards in a substantially equal volume to ensure uniform cooling of each circuit board in the circuit board enclosure assembly, despite an absence of circuit boards in any one of the slots of the circuit board enclosure assembly.

20 Claims, 4 Drawing Sheets

HIGH DENSITY CIRCUIT BOARD CHASSIS COOLING SYSTEM

The present invention relates to enclosures for circuit boards and, more particularly, to circuit board enclosures having improved cooling systems.

BACKGROUND OF THE INVENTION

Enclosures and cages for circuit boards have found great popularity due to their modularity. In recent times, circuit boards themselves have become more densely populated. That is, the number of components per circuit board continues to increase.

With greater component density, more heat is generated. But the volume in which to house the circuit boards has not increased. In fact, for certain applications there is a greater demand for smaller and smaller circuit board cages.

Since heat is being generated at an ever increasing rate and the volume of the enclosure cavity continues to decrease, solving the circuit board cage and enclosure cooling problem has become more difficult. Circuit board cage design has become more complex, and cooling these cages has become an art.

The prior art is replete with systems that increase cooling capacity of circuit board cages. All of them, however, lack the sort of heat removal capacity that is now required in high density applications.

In a standard VME (Versa Module European) chassis, heat generated by 1,000 watts to 1,500 watts of power must be removed. It is desirable to operate such systems within a strict temperature range featuring a temperature rise of only approximately 10 degrees Fahrenheit from a quiescent state. This narrow temperature differential, while necessary to ensure long component life, is increasingly difficult to achieve. In some cage designs, this objective is almost all but impossible to accomplish. Standard air flow procedures and cage designs simply no longer provide enough cooling for these high density systems.

Traditionally, so-called Muffin fans have been used to circulate air in these environments. But Muffin (tubaxial) fans are notoriously inefficient, and do not provide even air distribution. They generally provide a dead distribution profile at the hub, and a greater air flow capacity towards the edges of the blades.

DISCUSSION OF RELATED ART

In German Patent No. DE 37 34 972, issued Apr. 27, 1989, a housing is shown for supporting a number of circuit boards. Two fans mounted at the back of the housing direct air through a converging conduit upwardly through a filter, and into a cage of circuit boards. The air is discharged out the top of the circuit board cage. While the air flow system of this invention claims to provide a uniform flow of air to all the circuit boards in the cage, this is only accomplished when all the slots of the cage are filled. The system does not provide a high pressure flow that is directed through a plurality of channels. Therefore, there is lacking an individual flow through each circuit board slot independent of the rest. This results in a non-uniform air flow profile when one of the circuit boards is removed, or when one of the slots in the cage is left vacant. In addition, the filter of this system, not being adjacent to the cage of circuit boards, does not provide the necessary pressure head and turbulent flow needed to provide a substantially flat distribution flow profile.

In U.S. Pat. No. 4,489,363, issued to Goldberg on Dec. 18, 1984, an apparatus for cooling integrated circuit chips is illustrated. The air flow is directed through partitions from a main channel, and exits a rear channel. There is no suggestion to provide each circuit board with its own individual air flow.

A communication equipment cabinet cooling arrangement is shown in U.S. Pat. No. 4,860,163, issued to Sarath on Aug. 22, 1989. In this cooling system, a fan creates a vacuum in the circuit board cage. The air is sucked through the cage and is discharged through a restrictive side window. Individual circuit board air flow is not shown.

It would be advantageous to provide a system that will remove sufficient heat from a high density circuit board chassis.

It would also be advantageous to provide a system that would assure a substantially uniform flow over each of the circuit boards.

It would also be advantageous to perform efficient and uniform circuit board cage cooling regardless of the component density of the circuit board, and regardless of the reduction in the size of the circuit board cage.

It would also be advantageous to ensure that component location upon the board, whether farther from, or closer to, the source of air would not be of consequence in maintaining sufficient cooling of the circuits.

Most importantly, it would be advantageous to design a circuit board cage that would ensure that empty circuit board slots in the circuit board enclosure would not unduly rob or scavenge the air supply at the expense of the populated slots.

In order to generate the air pressure necessary to achieve the previous advantages, it would also be advantageous to use a cage type blower for cooling the circuit boards, rather than a standard or conventional Muffin fan.

SUMMARY OF THE INVENTION

In accordance with the present invention, there is provided a system for cooling a plurality of circuit boards in a high density chassis. The system includes a circuit board enclosure assembly having a number of slots for supporting a plurality of circuit boards. A filter is disposed beneath the circuit board enclosure assembly for filtering air flowing into the circuit board enclosure. The filter also creates air turbulence, and provides a pressure head adjacent the plurality of circuit boards.

An air flow is generated by a dual cage type blower that is offset from the circuit board enclosure assembly. The air flow to the circuit boards is at sufficient air pressure and air flow rate to carry heat from the circuit boards. A plenum fitted with diffusers disposed between the dual cage type blower and the circuit board enclosure assembly diffuses and directs the air flow to the circuit board enclosure assembly. The air is directed in a substantially flat profile for distribution to each of the circuit boards in a substantially equal volume. This ensures that uniform cooling of each circuit board in the circuit board enclosure assembly is accomplished despite an absence of circuit boards in any one or more of the slots of the circuit board enclosure assembly.

BRIEF DESCRIPTION OF THE DRAWINGS

A complete understanding of the present invention may be obtained by reference to the accompanying drawings, considered in conjunction with the subsequent detailed description, in which.

For the purposes of clarity and brevity, like elements and components shall bare the same designation throughout the figures.

DESCRIPTION OF THE PREFERRED EMBODIMENT

Generally speaking, the invention shows a modular unit for housing and cooling a number of circuit boards. The chassis of the system features a high density circuit board arrangement that provides sufficient cooling to meet stringent temperature range requirements. The invention is characterized by a unique plenum design that distributes the air flow equally to each circuit board slot in the circuit board enclosure assembly, and provides a uniform air pressure profile. The design of the system is such that equal air flow is maintained to each circuit board despite one or more empty slots in the circuit board enclosure assembly.

Figure 1:
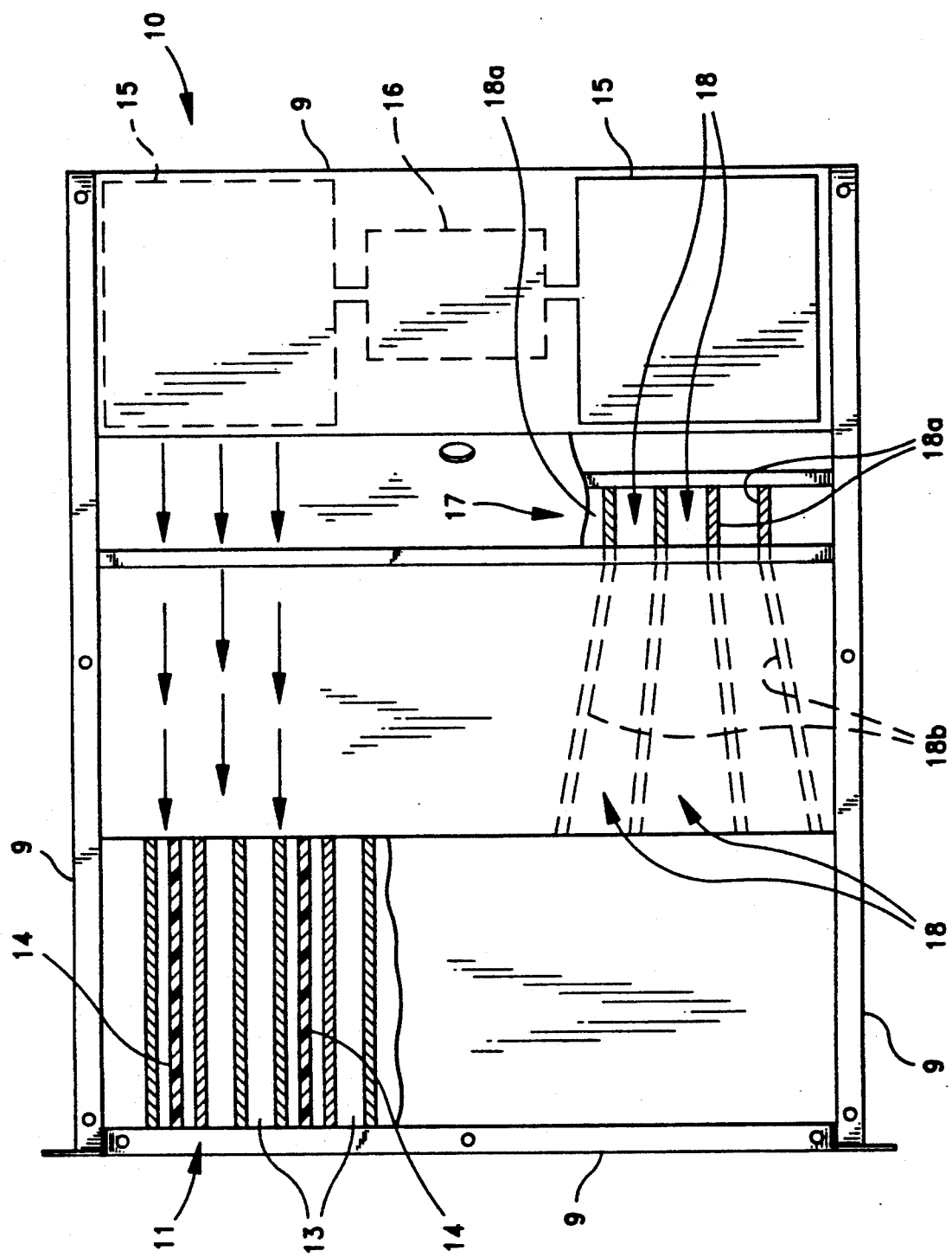
FIG. 1 illustrates a partially cutaway top plan view of the circuit board cage and air cooling system of this invention.

Now referring to FIG. 1, a top view of the modular unit for housing and cooling a plurality of circuit boards Now referring to FIG. 1, a top view of the modular unit for housing and cooling a plurality of circuit boards is depicted by reference numeral 10. The modular unit 10 is defined by a sheet metal housing 9 that has a cage 11 (shown in cutaway). The cage 11 features a number of slots 13 defined by vertically disposed circuit boards 14.

Figure 2:
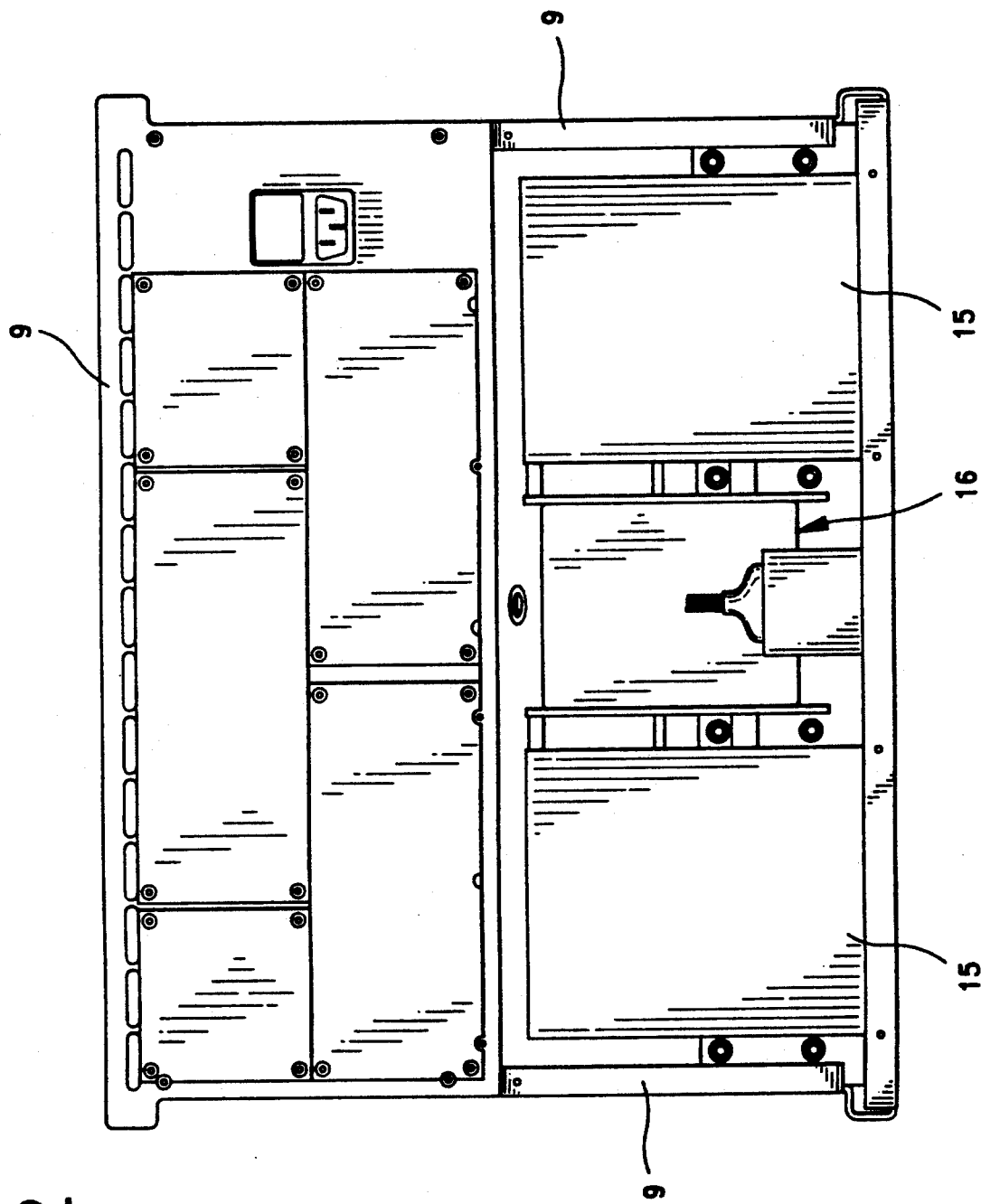
FIG. 2 depicts a back view of the air cooling system shown in FIG. 1, with the inlet screen removed.

The circuit boards 14 in slots 13 are cooled by a dual pair of high pressure squirrel cage blowers 15, such as Model No. KBB435, manufactured by Kooltronics, Inc. disposed at the rear of the housing 9, as also illustrated in FIG. 2. The high pressure blowers 15 are powered by a dual shafted, electrical motor 16, which is part of the blower assembly. Of course, it should be understood that other blowers commonly known in the art (e.g., tangential longitudinal blowers, ejector pumps, positive displacement blowers, etc.) may be used and are intended to fall within the scope of the invention.

Each blower 15 forces air through a plenum 17 having a plurality of channels 18 defined by walls 18a and 18b, respectively. The channels 18 are shown in greater detail in FIG. 4.

Figure 4:
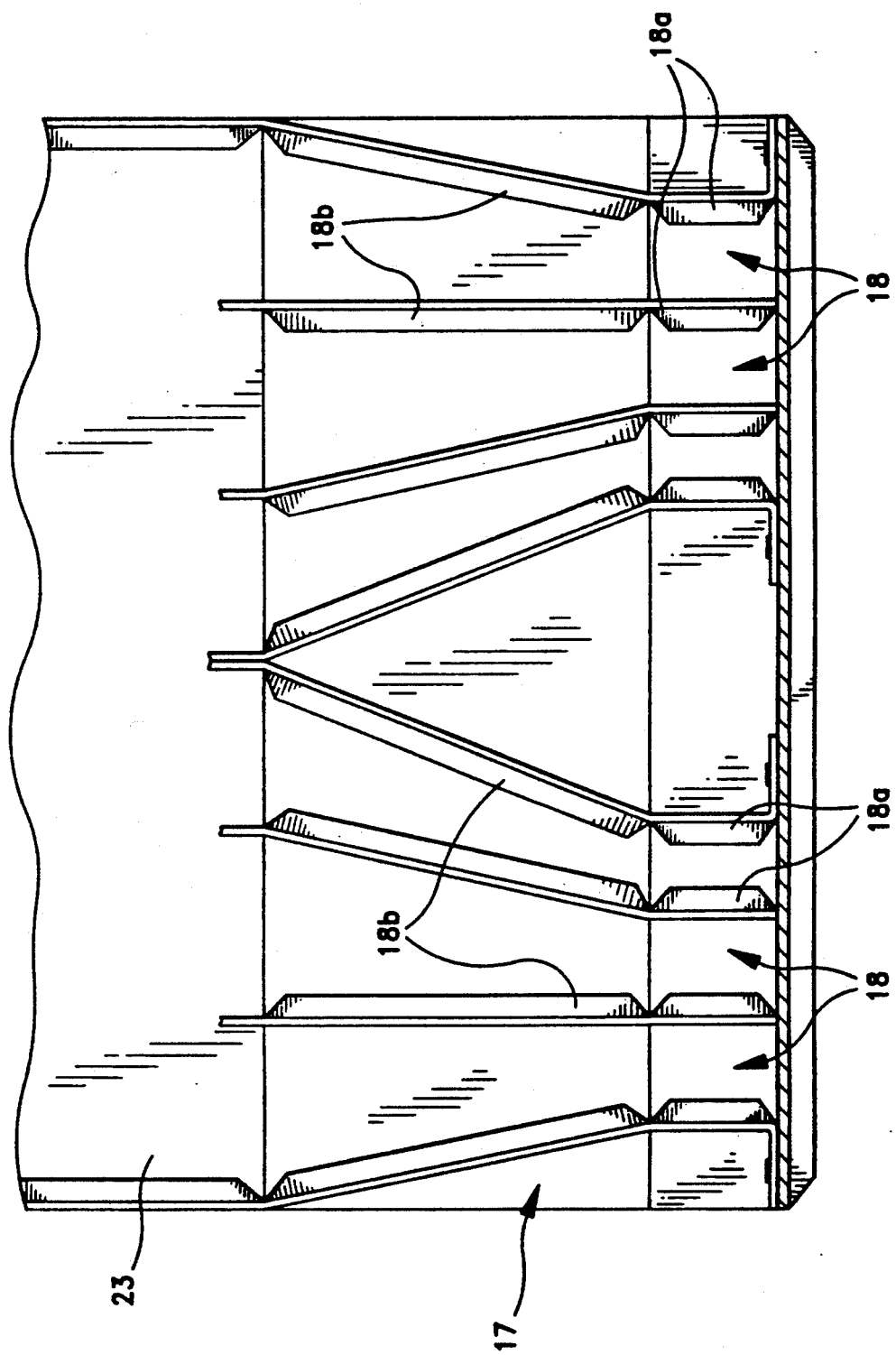
FIG. 4 depicts a bottom plan view of the plenum of the air cooling system shown in FIG. 1.

The channels 18 comprise a short inlet section defined by walls 18a, followed by a diffuser portion defined by long, diverging walls 18b. It should be noted that, while the uppermost inlet walls 18a are bent upwardly to become diffuser walls 18b in this FIGURE, an equally preferred embodiment would include diffuser walls that are unbent and linearly disposed along the entire length thereof, from the outlet of the blower 15 to the front of the housing extremity. The ends of channel structures 18b are shown in FIG. 4 as terminating at the filter 23. It should be understood, however, that these walls 18b can and should extend for a portion or for the entire length of the filter 23, which is especially desirable for configurations that comprise extremes of both high and low density boards.

Channels 18 conduct an equal amount of air to each of the slots 13 of cage 11. The air is fed to each circuit board 14 with a uniform pressure profile by virtue of the diffusing side walls 18b. The air is fed underneath cage 11 and flows upwardly (arrows 20) into slots 13, as better observed in FIG. 3.

Figure 3:
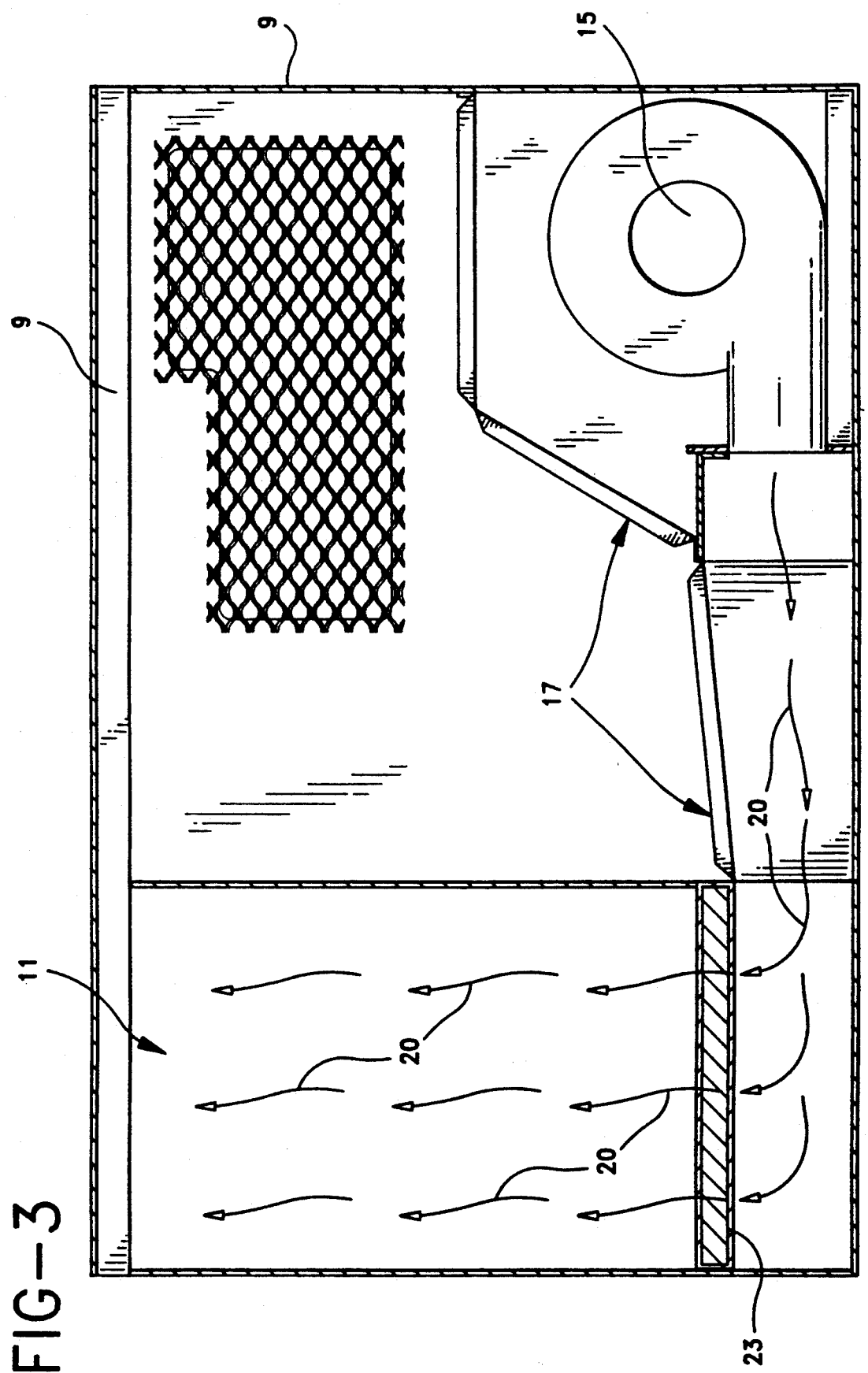
FIG. 3 shows a partially cutaway side view of the circuit board cage and air cooling system illustrated in FIG. 1.

Referring to FIG. 3, a filter 23 is disposed between the plenum 17 and the cage 11. The filter 23 is immediately adjacent cage 11, and provides a pressure head in the air flow 20 entering cage 11. The filter 23 is also designed to create a turbulent flow into slots 13 in order to further facilitate the cooling of circuit boards 14. The filter 23 of course has as its primary function to filter the air so that dirt will not accumulate on the circuit boards 14 or components (not shown), and thus impair heat dissipation therefrom.

Blowers 15 provide a flow rate output of approximately 550 CFM at 0" $H_2O$, or 300 CFM at 1" $H_2O$. This extremely high flow rate ensures that the circuit boards 14 will be sufficiently cooled by the air flow to maintain a narrow temperature gradient throughout the operation of the circuits.

In addition, the individual distribution of the air flow to each slot 13 ensures that despite the absence of one or more circuit boards 14 from any of the slots 13, each circuit board 14 will have the same amount of cooling air flowing over its surface. The pressure head and turbulence provided by filter 23 further enhances the cooling effect of the flowing air (arrows 20), such that the circuit board enclosure assembly defined by cage 11 is highly efficient to meet all specification requirements for high density circuit board assemblies.

The pressure head guarantees that the small differences in flow restriction caused by the components on the plurality of the boards does not substantially reduce the volume of air delivered and flowing through each slot. Smaller open areas result in higher linear air velocities, so that the velocity multiplied by the open area is a constant, representative of the volume of air per slot.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented by the subsequently appended claims.

What is claimed is:

1. A system cooling a plurality of circuit boards in a high density chassis, comprising:
   a) a circuit board cage having means defining a number of slots supporting a plurality of circuit boards, and means disposed in each of said slots for providing insertion, removal and support of a circuit board therein, without substantially changing air flow distribution to all the slots of said circuit board cage;
   b) filtering means disposed adjacent said circuit board cage for filtering air, creating air turbulence, and for providing a pressure head adjacent said plurality of circuit boards, said adjacent pressure head ensuring substantially equal air flow through said slots, with or in the absence of, a circuit board resident in any slot of said circuit board cage;

c) air flow generating means disposed proximate said filtering means for providing air flow through said filtering means to said slots of said cage at air pressures and air flow rates sufficient to carry heat from any resident circuit boards in said cage;

d) diffusing means operatively disposed between said air flow generating means and said circuit board cage, said diffusing means having a plurality of channels for individually directing air generated from said air flow generating means to respective slots in said cage, and for individually distributing air to each of said slots in a substantially equal volume to ensure uniform cooling of each resident circuit board in said circuit board cage despite an absence of a circuit board in any one of said slots of said circuit board cage; and said filtering means located between said diffusing means and said circuit boards.

2. The system for cooling a plurality of circuit boards in a high density chassis in accordance with claim 1, wherein said diffusing means includes a multi-channel plenum.

3. The system for cooling a plurality of circuit boards in a high density chassis in accordance with claim 1, wherein said air flow generating means comprises a blower.

4. The system for cooling a plurality of circuit boards in a high density chassis in accordance with claim 2, wherein said air flow generating means comprises a blower disposed adjacent said multi-channel plenum.

5. The system for cooling a plurality of circuit boards in a high density chassis in accordance with claim 1, wherein said air flow generating means provides a volumetric flow exceeding 500 cubic feet per minute at a pressure of 0" $H_2O$.

6. The system for cooling a plurality of circuit boards in a high density chassis in accordance with claim 1, wherein said filtering means is disposed beneath said circuit board cage adjacent said diffusing means.

7. The system for cooling a plurality of circuit boards in a high density chassis in accordance with claim 1, wherein said air flow generating means comprises a dual cage type blower.

8. The system for cooling a plurality of circuit boards in a high density chassis in accordance with claim 2, wherein said air flow generating means comprises a dual cage type blower disposed adjacent said multi-channel plenum.

9. The system for cooling a plurality of circuit boards in a high density chassis in accordance with claim 1, wherein said diffusing means includes a multi-channel plenum disposed below said circuit board cage for directing air upwardly through said circuit boards.

10. A system cooling a plurality of circuit boards in a high density chassis, comprising:

a) a circuit board cage having means defining a number of slots supporting a plurality of circuit boards, and means disposed in each of said slots for providing insertion, removal and support of a circuit board therein, without substantially changing air flow distribution to all the slots of said circuit board cage;

b) filtering means disposed adjacent said circuit board cage for filtering air, creating air turbulence, and for providing a pressure head adjacent said plurality of circuit boards, said adjacent pressure head ensuring substantially equal air flow through said slots, with or in the absence of, a circuit board resident in any slot of said circuit board cage;

c) air flow generating means disposed proximate said filtering means for providing air flow through said filtering means to said slots of said cage at air pressures and air flow rates sufficient to carry heat from any resident circuit boards in said cage;

d) conduit means operatively disposed between said air flow generating means and said circuit board cage, said conduit means having a plurality of channels for directing air generated from said air flow generating means to said circuit board cage, and for individually distributing air to each of said slots of said cage in a substantially equal volume to ensure uniform cooling of each resident circuit board in said circuit board cage despite an absence of a circuit board in any one of said slots of said circuit board cage; and said filtering means located between said conduit means and said circuit boards.

11. The system for cooling a plurality of circuit boards in a high density chassis in accordance with claim 10, wherein said conduit means includes a multi-channel plenum having channels that diffuse the air flow.

12. The system for cooling a plurality of circuit boards in a high density chassis in accordance with claim 10, wherein said air flow generating means comprises a blower.

13. The system for cooling a plurality of circuit boards in a high density chassis in accordance with claim 11, wherein said air flow generating means comprises a blower disposed adjacent said multi-channel plenum.

14. The system for cooling a plurality of circuit boards in a high density chassis in accordance with claim 10, wherein said air flow generating means provides a volumetric flow exceeding 500 cubic feet per minute at a pressure of 0" $H_2O$.

15. The system for cooling a plurality of circuit boards in a high density chassis in accordance with claim 10, wherein said filtering means is disposed beneath said circuit board cage adjacent said conduit means.

16. The system for cooling a plurality of circuit boards in a high density chassis in accordance with claim 10, wherein said air flow generating means comprises a cage type blower.

17. The system for cooling a plurality of circuit boards in a high density chassis in accordance with claim 16, wherein said blower comprises a dual cage.

18. The system for cooling a plurality of circuit boards in a high density chassis in accordance with claim 11, wherein said air flow generating means comprises a cage type blower disposed adjacent said multi-channel plenum.

19. The system for cooling a plurality of circuit boards in a high density chassis in accordance with claim 18, wherein said blower comprises a dual cage.

20. The system for cooling a plurality of circuit boards in a high density chassis in accordance with claim 10, wherein said conduit means includes a multi-channel plenum disposed below said circuit board cage for directing air upwardly through said circuit boards.

* * * * *